(12) United States Patent
Ullmann et al.

(10) Patent No.: US 8,144,495 B2
(45) Date of Patent: Mar. 27, 2012

(54) METHOD FOR PROGRAMMING AN ELECTRONIC CIRCUIT AND ELECTRONIC CIRCUIT

(75) Inventors: Andreas Ullmann, Zirndorf (DE); Walter Fix, Nuremberg (DE)

(73) Assignee: PolyIC GmbH & Co. KG, Furth (DE)

( * ) Notice: Subject to any disclaimer, the term of this patent is extended or adjusted under 35 U.S.C. 154(b) by 856 days.

(21) Appl. No.: 12/293,852

(22) PCT Filed: Mar. 21, 2007

(86) PCT No.: PCT/EP2007/002512
§ 371 (c)(1),
(2), (4) Date: Sep. 22, 2008

(87) PCT Pub. No.: WO2007/107357
PCT Pub. Date: Sep. 27, 2007

(65) Prior Publication Data
US 2009/0121218 A1    May 14, 2009

(30) Foreign Application Priority Data
Mar. 22, 2006  (DE) .................. 10 2006 013 605

(51) Int. Cl.
*G11C 5/06* (2006.01)

(52) U.S. Cl. ................. 365/63; 257/40; 365/94; 438/99

(58) Field of Classification Search .................. None
See application file for complete search history.

(56) References Cited

U.S. PATENT DOCUMENTS

| | | | |
|---|---|---|---|
| 4,937,119 A | 6/1990 | Nikles et al. | |
| 5,574,291 A | 11/1996 | Dodabalapur et al. | |
| 5,625,199 A | 4/1997 | Baumbach et al. | |
| 5,883,397 A | 3/1999 | Isoda et al. | |
| 5,998,805 A | 12/1999 | Shi et al. | |
| 6,072,716 A | 6/2000 | Jacobson et al. | |
| 6,384,804 B1 | 5/2002 | Dodabalapur et al. | |
| 6,864,118 B2* | 3/2005 | Stasiak | 438/99 |
| 6,903,958 B2 | 6/2005 | Bernds et al. | |
| 7,935,565 B2* | 5/2011 | Brown et al. | 438/99 |
| 2003/0151028 A1* | 8/2003 | Lawrence et al. | 252/500 |

(Continued)

FOREIGN PATENT DOCUMENTS

EP    0108650    5/1984

(Continued)

OTHER PUBLICATIONS

Carr, et al, "MOS/LSI Design and Applications", 1972, Mc-Graw Hill, New York, US, XP002189001 7630. Relevancy: p. 196, line 33—p. 197, line 6; figure 7.1.

(Continued)

*Primary Examiner* — Alexander Sofocleous
(74) *Attorney, Agent, or Firm* — Carella, Byrne et al.; Elliot M. Olstein; William Squire

(57) ABSTRACT

The invention relates to a method for producing an electronic circuit, and to an electronic circuit, having at least one organic electrical functional layer and at least one data storage unit, the data storage unit being configured with two electrically conductive layer contacts. The two electrically conductive layer contacts are arranged alongside one another and are electrically conductively connected to one another either by an electrically conductive dry substance or by an electrically conductive solidified substance.

37 Claims, 5 Drawing Sheets

U.S. PATENT DOCUMENTS

Figure 1:
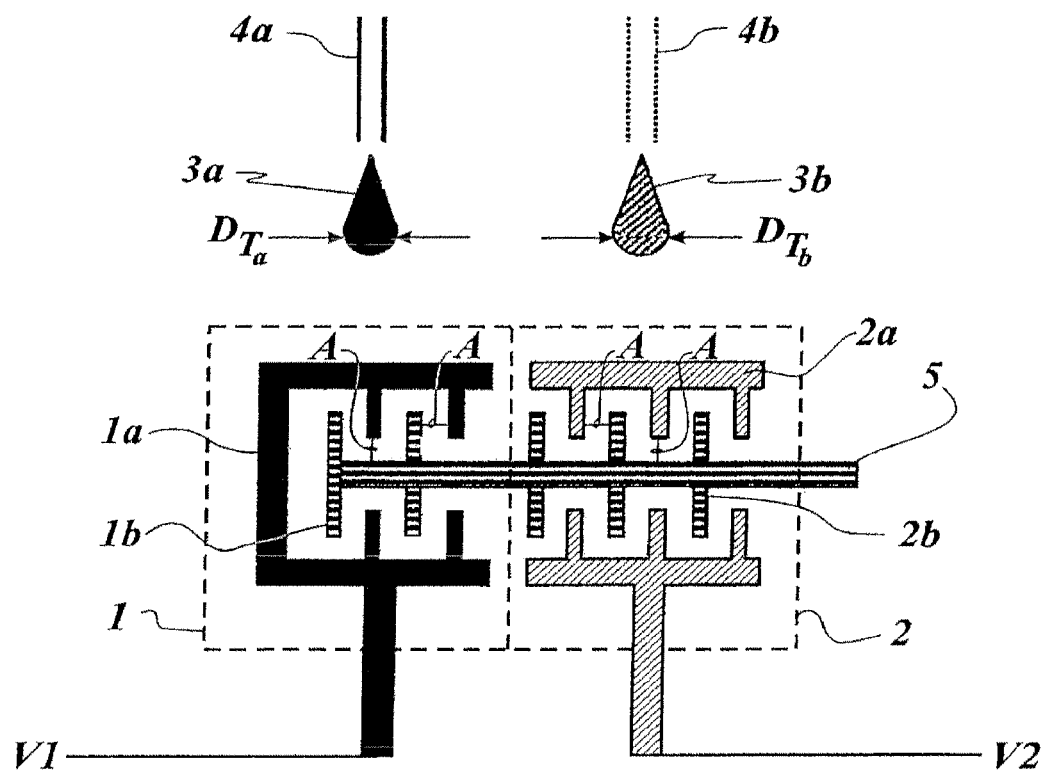

2004/0084670 A1     5/2004   Tripsas et al.

FOREIGN PATENT DOCUMENTS

| EP | 0418504 | 3/1991 |
|----|---------|--------|
| EP | 1186042 | 3/2002 |
| EP | 1 296 280 | 3/2003 |
| JP | 60117769 | 11/1983 |
| JP | 01169942 | 7/1989 |
| WO | 9930432 | 6/1999 |
| WO | 0173845 | 10/2001 |

OTHER PUBLICATIONS

Drury et al., "Low-Cost All-Polymer Integrated Circuits", American Institute of Physics, Applied Physics Letters, 1998, vol. 73, No. 1, pp. 108-110, Jul. 6, 1998.

Forrest et al.: "The Dawn of Organic Electronics", IEEE Spectrum, Aug. 2000, pp. 29-34, XP002189000, IEEE Inc., New York, US ISSN:0018-9235, Relevancy: p. 33, line 58—p. 34, line 24; figure 5.

Hergel, H. J.: "Pld-Programmiertechnologien", Elektronik, Franzis Verlag GMBH. Munchen, DE, vol. 41, No. 5, Mar. 3, 1992, pp. 44-46.

Kuhlmann et al., "Terabytes in Plastikfolie", Organische Massenspeicher,1998, Book 3, pp. 18-19.

Zangara L., "Metall Staff Halbleiter, Programmierung Von Embedded ROMS Ueber Die Metallsierungen", Elektronik, Franzis Verlag GmbH, Munchen, DE, vol. 47, No. 16, Aug. 4, 1998, pp. 52-55.

International Search Report for PCT/DE 01/03400 completed Feb. 4, 2002.

Kuhlmann et al., "Terabytes in Plastikfolie", Organische Massenspeicher vor der Serienproduktion.

Hergel, H. J.: "Pld-Programmiertechnologien", Elektronik, Franzis Verlag GMBH. Munchen, DE, Bd 41, Nr. 5, Mar. 3, 1992, Seiten 44-46, XP000293121, ISSN: 0013-5658, Abbildungen 1-3.

Zangara L., "Metall Statt Halbleiter, Programmierung Von Embedded ROMS Ueber Die Metallisierungen", Elektronik, Franzis Verlag GmbH, Munchen, DE, vol. 47, No. 16, Aug. 4, 1998, pp. 52-55.

* cited by examiner

METHOD FOR PROGRAMMING AN ELECTRONIC CIRCUIT AND ELECTRONIC CIRCUIT

The invention relates to a method for programming an electronic circuit, and to an electronic circuit, having at least one organic electrical functional layer and at least one data storage unit, the data storage unit being configured with two electrically conductive layer contacts.

DE 100 45 192 A1 discloses methods for producing electronic circuits containing data storage devices which are based on organic material. The data storage devices are used in combination with an organic integrated circuit (integrated plastic circuit), in particular for an RFID tag (RFID tags: radio frequency identification tags). In this case the electronic circuit is programmed or the data storage device is written to either by targeted omission of interconnects or components of the electronic circuit as early as during the production thereof or by manipulation of interconnects in such a way that the latter are subsequently made conductive or nonconductive. In this case, interconnects are made nonconductive by laser irradiation or heat introduced in a targeted manner, conductive regions are made nonconductive, or vice versa, by chemical treatment such as e.g. base/acid stamp, interconnects are severed by mechanical treatment, a short circuit is brought about by electrical voltage and destruction of an interconnect is thus brought about by local overheating, interconnects are configured as "fusible links" which are interrupted by current, or the electric constant of a material is changed by laser irradiation.

Electronic circuits, in particular organic integrated circuits based on organic field effect transistors (OFETs), are required for microelectronic mass applications and disposable products such as identification and product tags that can be read contactlessly. In this case, the excellent operating behavior of silicon technology can be dispensed with, but in return very low production costs and high mechanical flexibility are to be ensured. The devices are typically single-use products.

It is an object of the invention to provide a further method for programming an electronic circuit comprising a data storage device, and also a further electronic circuit comprising a data storage device. In the claims, the term "data storage" unit is referred to as a "circuit selective coupling" unit to reflect its function on a coupled logic element according to a disclosed embodiment. In this embodiment, these units selectively set the output data level of a coupled logic element, e.g., shown as inverter 6 output signals, signals a2, a3, a4, and b2, b3, and b4, respectively, of FIGS. 3 and 4a. Thus the term "data storage unit" through the specification is also intended to further reflect the term "circuit selective coupling unit."

The object is achieved for the method for programming an electronic circuit having at least one organic electrical functional layer and at least one data storage unit, the data storage unit being configured with two electrically conductive layer contacts, by virtue of the fact that the two electrically conductive layer contacts are formed adjacent from one another, preferably alongside one another in a plane and that a liquid substance containing an electrically conductive material is applied to the data storage unit in such a way that the liquid substance at least partly wets both electrically conductive layer contacts.

The storage of a data bit in an electronic circuit can be carried out in a particularly simple and cost-effective manner by means of a method of this type. In particular, the method according to the invention is suitable for programming integrated circuits, such as transponder circuits, for example, and enables an individual programming of the data storage unit and thus of the electronic circuit both during the production of the electronic circuit and by the final purchaser of the electronic circuit. The programming is effected irreversibly in this case.

The method according to the invention is particularly suitable for producing printed circuits, in particular printed organic circuits which contain at least one printed organic functional layer and are produced on a flexible substrate. In this case, a data storage element is formed for example simultaneously and preferably in a plane with an electrode layer, for example of an organic logic element. The desired programming can thereupon be effected and, finally, further layers of the electronic circuit or an encapsulation layer can be applied. The method according to the invention can be optimally integrated into a roll-to-roll method in which a flexible substrate for receiving the electronic circuit is unwound from one roll and, after electrical functional layers have been applied, is wound up onto a second roll.

The object is achieved for the electronic circuit having at least one organic electrical functional layer and at least one data storage unit, the data storage unit having two electrically conductive layer contacts, by virtue of the fact that the two electrically conductive layer contacts are arranged alongside one another, preferably in a plane, and that a) an electrically conductive dry substance or
b) an electrically conductive solidified substance electrically conductively connects the two electrically conductive layer contacts to one another.

Such an electronic circuit, which can be formed in particular by means of the method according to the invention, is particularly cost-effective. The data storage unit cannot be written to again or differently. Furthermore, the data storage unit can be integrated layer-sequence-compatibly into the electronic circuit, which is formed in particular at least partly by a printing method. The electronic circuit is preferably an integrated circuit, in particular an organic integrated circuit which comprises at least one organic electrical functional layer which is formed by printing.

The term "organic material" here encompasses all types of organic, organometallic and/or inorganic plastics. This involves all types of materials with the exception of the semiconductors which form the traditional diodes (germanium, silicon) and the typical metallic conductors. A restriction in the dogmatic sense to organic material as carbon-containing material is accordingly not intended; rather, the broad use of e.g. silicones is also envisaged. Furthermore, the term is not intended to be subject to any restriction with regard to the molecular size, in particular to polymeric and/or oligomeric materials; rather, the use of "small molecules" is indeed possible as well.

Both rigid and flexible substrates can be used as carriers for the electronic circuit. Preference is given here to flexible substrates in the form of films or film tracks which can be processed and printed continuously in the roll-to-roll method. Appropriate substrate materials include paper, PET, polyester, PEN or polyamides, for example, which preferably have a thickness within the range of 12 to 100 μm.

For the method it has proved to be particularly worthwhile if the liquid substance is applied dropwise or dabbed on. In this case, the layer contacts and the regions between the two layer contacts ideally come into contact only with the liquid substance, thereby minimizing the risk of contamination, in particular of organic materials, or damage of adjoining layers of the electronic circuit.

By means of the process steps mentioned above, the storage device can be written to only once. The programming can be effected during the production of the tag or product or during the mounting of the electronic unit (e.g. luggage label, electronic stamp, ticket, each ticket having its own storage content). At the same time this technique can also be used for rendering an electronic unit, such as e.g. an electronic bar code or an electronic ticket, unusable deliberately after use by virtue of a specific bit arrangement being programmed in deliberately after use (upon invalidation of the ticket, upon payment at the cash desk) or the storage device being made unreadable.

In this case, it has proved to be advantageous if only an individual drop of the liquid substance is applied. An individual drop can be exactly metered and positioned, the suitable drop diameter being formed by way of the metering quantity of liquid substance.

Preferably, the liquid substance is dried, such that an electrically conductive dry substance comprising the electrically conductive material is formed, which electrically conductively connects the two electrically conductive layer contacts to one another. If the liquid substance is not immediately dried or caused to solidify, care should be taken to ensure that application of further layers does not lead to smearing of the liquid substance. This can be ensured by establishing suitable viscosities for the liquid substance and the layer materials to be printed or to be applied in some other way thereabove.

In this case, the liquid substance can be applied in the form of a solution, a suspension, an ink or a paste. The lower the viscosity with which the liquid substance is used, the simpler the metering and positioning of said substance.

It is particularly preferred if the liquid substance is applied by means of an inkjet printer.

Furthermore, it has proved to be worthwhile if the liquid substance is applied in the form of a melt, that the liquid substance is cooled, and that an electrically conductive solidified substance comprising the electrically conductive material is formed, which electrically conductively connects the two electrically conductive layer contacts to one another.

In this case it is advantageous if the melt is applied dropwise or is applied by means of an inkjet printer or by means of a thermal transfer method.

The liquid substance preferably has a content of electrically conductive material within the range of 10 to 90, preferably of 60 to 80, % by weight. Depending on whether a solution, suspension, ink, paste or melt serves as liquid substance, different minimum contents of electrically conductive material are necessary in order to form an electrically conductive connection between the two layer contacts of a data storage element.

The electrically conductive material is selected from the group of the metallic and/or organic conductive materials, preferably noble metals such as gold or silver and, as conductive organic materials, preferably Pani, Pedot or polypyrrol and carbon being used. Thus, a conductive silver paste or printing ink having a high proportion of carbon, such as black printer's ink, for example, can serve as the liquid substance.

In the case of the electronic circuit, in case a) the electrically conductive dry substance or in case b) the electrically conductive solidified substance has the electrically conductive material from the group of the metallic and/or organic conductive materials. The dry substance or the solidified substance can comprise further materials such as binders, adhesives, residues of chemical additives such as plasticizers or stabilizers, dyes or the like.

It has proved worthwhile if the at least one organic electrical functional layer is printed. However, electrode layers can for example also be formed photolithographically, by cathode sputtering or vapor deposition.

Furthermore, it has proved worthwhile if the two electrically conductive layer contacts of a data storage unit are formed in a plane with an electrically conductive functional layer, in particular in the same work operation as the electrically conductive functional layer.

Furthermore, it is advantageous to apply at least one electrical functional layer of the electronic circuit to the electrically conductive dry substance or to the electrically conductive solidified substance. It is particularly preferred to lead current-carrying electrode layers or interconnects thereabove in order to impede access to the data storage unit and thus to prevent attempts at carrying out an alteration of the programming. As an alternative, the electrically conductive dry substance or the electrically conductive solidified substance can be covered with a sealing layer.

By means of such a procedure, the electrically conductive dry substance or the electrically conductive solidified substance is integrated into the construction of the electronic circuit and optimally protected against later undesirable reprogramming.

With regard to an electrical connection that can be produced in an uncomplicated manner between the two layer contacts of a data storage unit, it has proved to be advantageous if the two electrically conductive layer contacts of a data storage unit are arranged at a distance A within the range of 1 µm to 100 µm away from one another.

It is advantageous if at least one layer contact of a data storage unit is configured in comb-shaped fashion with at least two comb tines, and the two electrically conductive layer contacts are arranged in a manner intermeshed with one another. If both electrically conductive layer contacts of a data storage unit have comb structures, then these are arranged in such a way that the comb structures of the two layer contacts engage in one another without touching one another.

However, other forms for the layer contacts are also possible as long as regions which form the two electrically conductive layer contacts of a data storage unit are present alongside one another at the distance A. In the simplest case, the layer contacts are configured as simple parallel interconnects.

The layer contacts of a data storage device lie alongside one another preferably on one plane, but an arrangement on different planes is also possible as long as the accessibility for the liquid substance is not lost and the region between the two layer contacts can be wetted by the liquid substance. The dry substance or solidified substance formed from the liquid substance has to reliably electrically conductively connect layer contacts in different planes of an, in particular printed, electronic circuit, a layer thickness that is as uniform as possible being intended to result in order to avoid local nonreactive resistances on account of excessively small local line cross sections.

If the liquid substance is applied dropwise onto two layer contacts, a drop diameter $D_T$ of the liquid substance is preferably chosen to be greater than the distance A. In this case, the width of a layer contact is crucial which borders directly on the distance A and borders on the distance A in the direction of the distance A. The larger the drop diameter is chosen to be with regard to the distance A between the two layer contacts of a data storage unit, the less stringent the requirements imposed on an exact positioning of the drop.

If the liquid substance is applied dropwise onto two layer contacts, at least one being configured in comb-shaped fashion, a drop diameter $D_T$ of the liquid substance is preferably chosen to be at least as large as the sum of double the distance A and triple the width of a comb tine. A chosen drop diameter has to reliably ensure a wetting of both layer contacts of a data storage element with the liquid substance, it being necessary to take account of the positional tolerances that occur from a production-technological standpoint in the positioning of the two layer contacts. Inaccuracies in the positioning of the drop must also not lead to only one of the two layer contacts being wetted and hence no electrically conductive connection arising.

The drop diameter can also be configured to be less than the distance A if upon impinging on the data storage unit, on account of suitable surface tensions, the drop runs or spreads in such a way that the two layer contacts are nevertheless wetted.

The two electrically conductive layer contacts of a data storage element preferably each have a thickness within the range of 10 nm to 2 µm. The width of the two electrically conductive layer contacts preferably lies in each case within the range of 1 µm to 100 µm. Identical widths for the two layer contacts of a data storage unit are generally preferred here.

It has proved worthwhile if the electronic circuit has two data storage units arranged alongside one another. In this case, it is preferred if an electrically conductive layer contact of a first data storage unit is electrically conductively connected to at least one electrically conductive layer contact of a second data storage unit. In this case, it is advantageous to connect those layer contacts of the two data storage units which are not connected to one another to the positive pole of a voltage source for one data storage unit and to the negative pole of said voltage source for the other data storage unit. The programming of the electronic circuit becomes particularly tamperproof as a result.

It has proved worthwhile if the at least one organic electrical functional layer of the electronic circuit is formed by printing, for the at least two data storage elements to be arranged on a line one behind another as seen in the printing direction of the electronic circuit. This facilitates the later programming or punctiform positioning of the liquid substance.

Preferably, the electronic circuit is programmed in a roll-to-roll method during the production of the electronic circuit.

An electrically conductive layer contact of a data storage unit is connected to regions of the electronic circuit in a targeted manner. The electronic circuit preferably comprises at least one organic logic gate which is electrically conductively connected to the at least one data storage unit. The connected regions of the electronic circuit are preferably situated between a decoder region, in which the data storage interrogation sequence is generated, and the organic logic gate. In this case, a parallel input signal is converted into a sequential output signal. Inverter components, NOR gates or NAND gates are usually used as organic logic gate for the realization of the storage property. The signal of the organic logic gate is suppressed depending on writing or not writing to a data storage unit.

If the signal of the logic gate is suppressed by a connection between the two layer contacts of a data storage unit being formed or not being formed, then the storage device is set to the value "0" or "1".

The organic inverter component is preferably formed by an organic field effect transistor (OFET) having a drain electrode and a source electrode, a gate electrode and also a semiconducting layer and an electrically insulating layer. The at least one data storage unit is preferably arranged on the plane of the drain, source or gate electrode.

It has proved worthwhile if the at least one data storage unit is arranged in a supply voltage path of the organic logic gate.

Furthermore, it has proved worthwhile to arrange the at least one data storage unit in a signal input path of the organic logic gate.

Furthermore, it has proved worthwhile to arrange the at least one data storage unit in a signal output path of the organic logic gate.

In the case where two data storage units are present and they have a common electrically conductive layer contact, the common layer contact of the two data storage units is preferably connected to the organic logic gate.

The use of an electronic circuit according to the invention for forming identification or product labels that can be read contactlessly is ideal.

Figure 2:
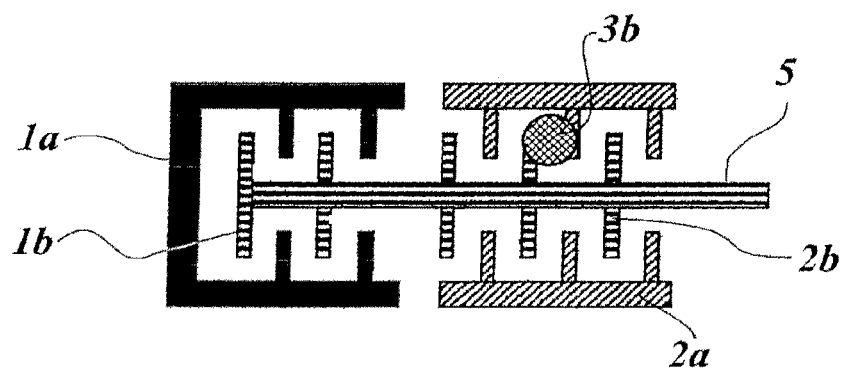
Figure 3:
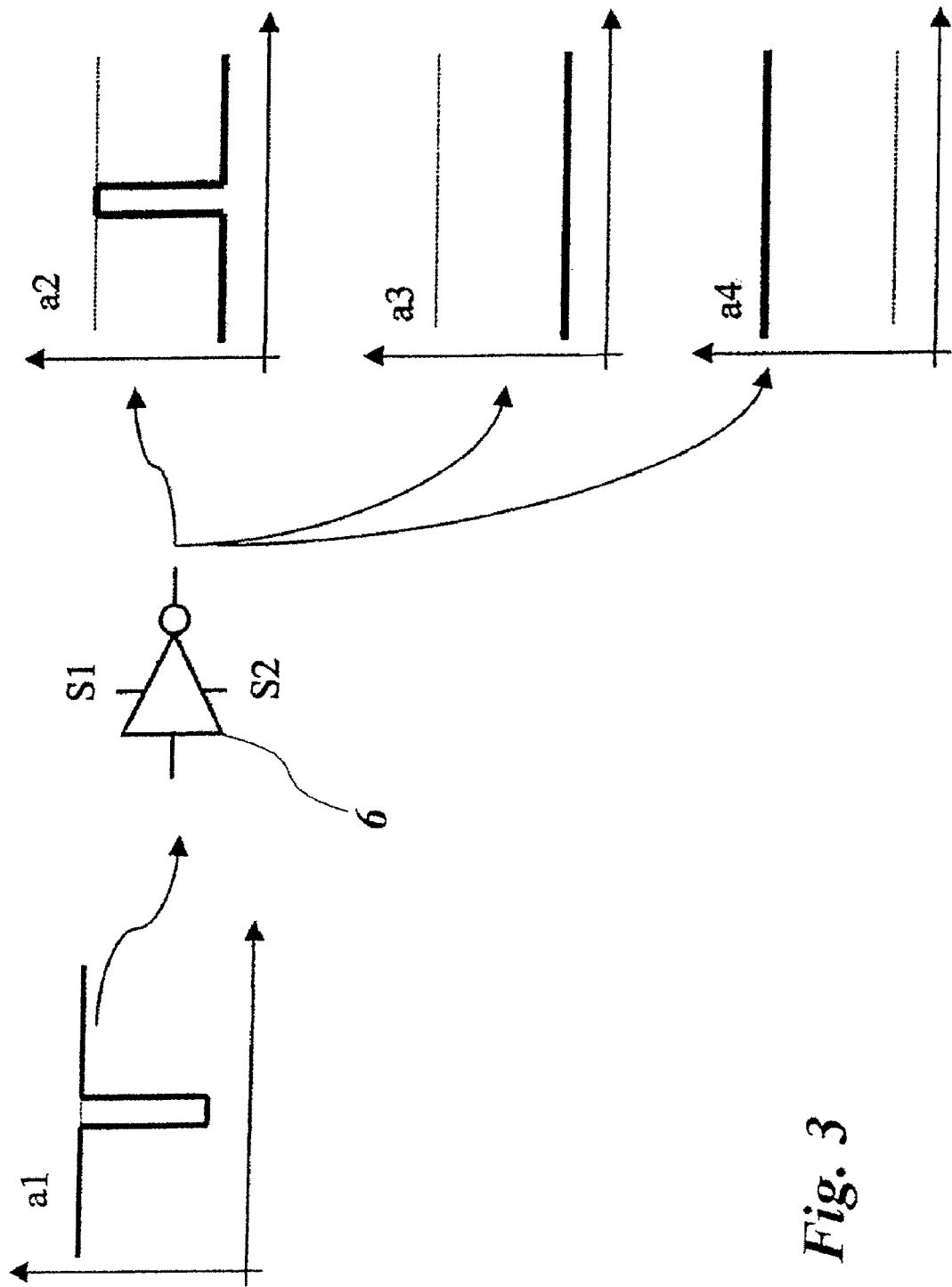
Figure 4A:
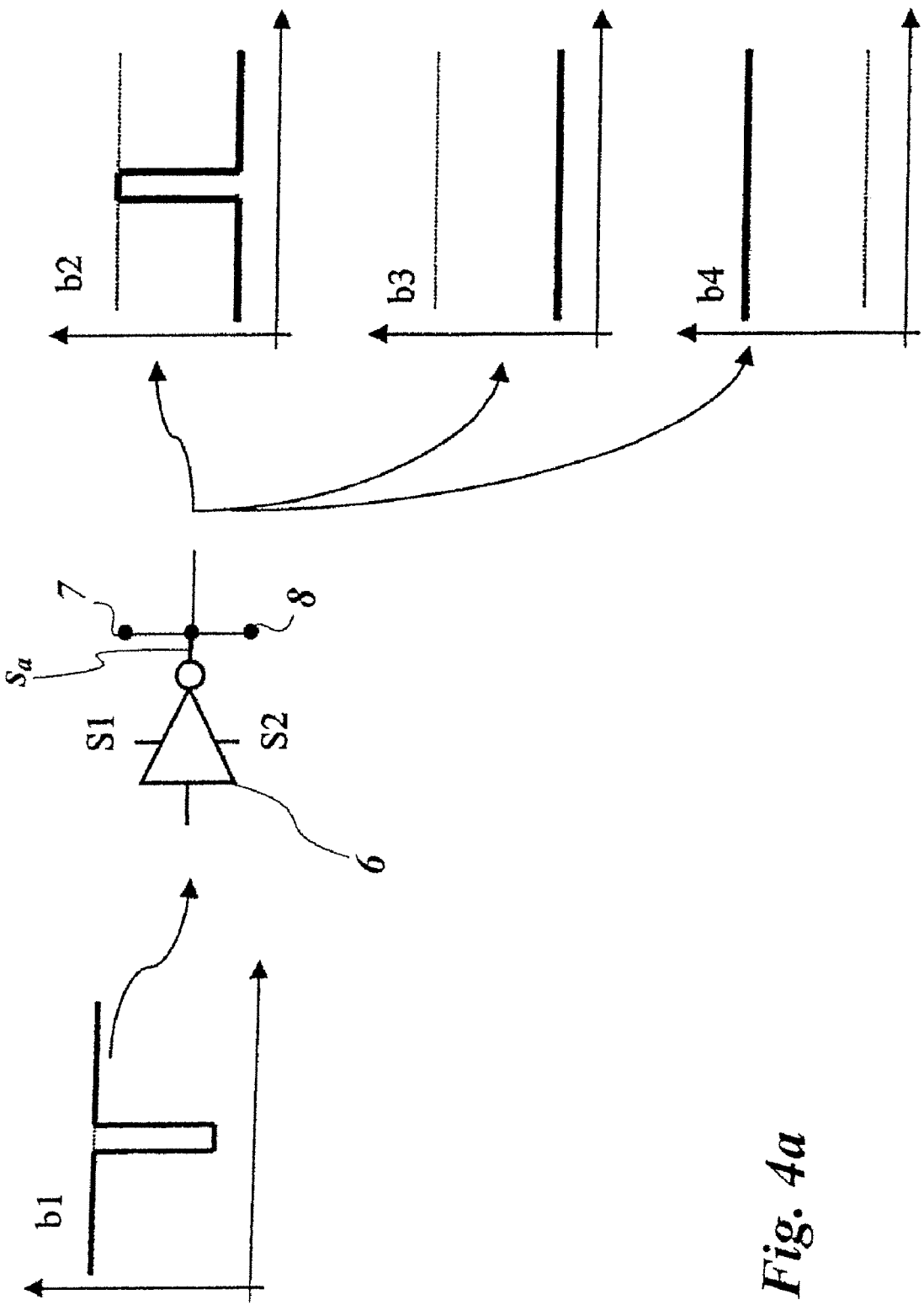
Figure 4B:
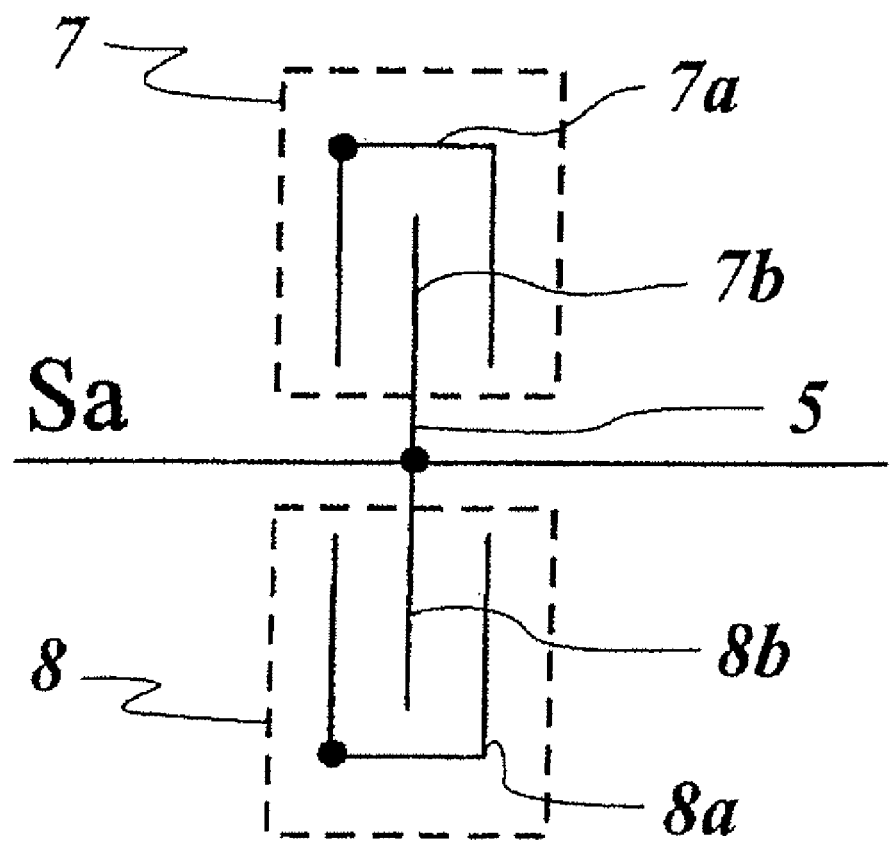
Figure 5:
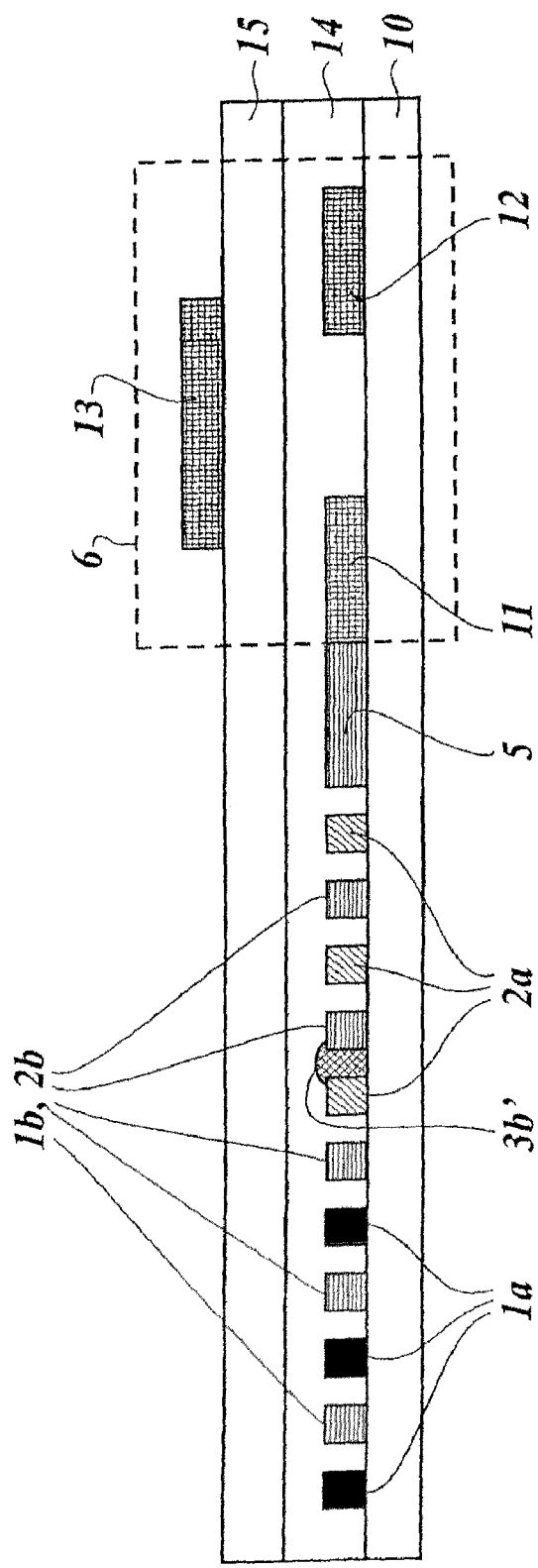

The invention will now be explained by way of example below with reference to FIGS. 1 to 5. Thus, FIG. 1 shows two data storage units arranged alongside one another with a common electrical layer contact, FIG. 2 shows a simplified illustration of the data storage units from FIG. 1, with a drop having been applied to the data storage unit 2, FIG. 3 shows different output signals for different circuitry connection of an inverter component in the region of the terminals S1 and S2, FIG. 4a shows different output signals for different circuitry connection of an inverter component in the region of the output signal contact Sa, FIG. 4b shows a detail view of the two data storage units from FIG. 4a, FIG. 5 shows a cross section through a printed electronic circuit in the region of an OFET which is connected to two data storage units in accordance with FIG. 2.

FIG. 1 shows a first data storage unit 1 and a second data storage unit 2, such as can occur in the electronic circuit, in plan view. The first data storage unit 1 has a first electrically conductive layer contact 1a and a second electrically conductive layer contact 1b, which are arranged in a manner spaced apart from one another at a distance A=50 µm in a plane on a substrate (not illustrated here) composed of PET film. The first and the second electrically conductive layer contacts 1a, 1b are formed from electrically conductive polypyrrol with a width of 20 µm and with a thickness of 100 nm. Both the first and the second electrically conductive layer contacts 1a, 1b have comblike structures which are arranged in a manner intermeshed with one another. A first voltage V1 is present at the first layer contact 1a of the first data storage unit 1.

The second data storage unit 2 has a third electrically conductive layer contact 2a and a fourth electrically conductive layer contact 2b, which are arranged in a manner spaced apart from one another likewise at a distance A=50 µm in a plane on the substrate (not illustrated here). The third and the fourth electrically conductive layer contacts 2a, 2b are likewise formed from electrically conductive polypyrrol with a width of 10 µm and with a thickness of 100 µm. Both the third and the fourth electrically conductive layer contacts 2a, 2b have comblike structures arranged in a manner intermeshed with one another. A second voltage V2 is present at the third layer contact 2a of the second data storage unit 2.

The second layer contact 1b of the first data storage unit 1 is electrically conductively connected to the fourth layer contact 2b of the second data storage unit 2. This layer contact, referred to hereinafter as common layer contact 1b, 2b, is electrically conductively connected via an interconnect 5 to an organic logic gate (not shown here), here an organic inverter component 6 (see FIGS. 3 and 4) of the electronic circuit.

A first drop 3a of a liquid substance is illustrated above the first data storage unit 1, which first drop can be dripped onto the first data storage unit 1 by means of a capillary 4a. A second drop 3b of a liquid substance is illustrated above the second data storage unit 2, which second drop can be dripped onto the second data storage unit 2 by means of a capillary 4b. In this case, optionally the first drop 3a and/or the second drop 3b or else neither of the two drops can be applied dropwise. A first drop 3a applied dropwise onto the first data storage unit 1 is intended to wet the first layer contact 1a and also the second layer contact 1b. A drop diameter $D_{Ta}$ of the first drop 3a should be chosen correspondingly in coordination with the distance A. After the drying or solidification of the first drop 3a, an electrically conductive connection is present between the first layer contact 1a and the second layer contact 1b, such that the first voltage V1 is present at the inverter component (not illustrated) via the interconnect 5.

A second drop 3b applied dropwise onto the second data storage unit 2 is intended to wet the third layer contact 2a and also the fourth layer contact 2b. A drop diameter $D_{Tb}$ of the second drop 3b should be chosen correspondingly in coordination with the distance A. After the drying or solidification of the second drop 3b, an electrically conductive connection is present between the third layer contact 2a and the fourth layer contact 2b, such that the second voltage V2 is present at the inverter component (not illustrated) via the interconnect 5.

If both the first drop 3a and the second drop 3b are applied dropwise, V1 and V2 are connected. If, by way of example, a positive voltage is present at the first layer contact 1a and the third layer contact 2a is grounded, then a short circuit is produced. With the data storage arrangements illustrated in FIG. 1, an inverter component of an electronic circuit can thus be connected up with different signals in a simple manner.

The liquid substance used is a solution containing polypyrrol as electrically conductive material.

FIG. 2 shows a simplified illustration of the first and second data storage units 1, 2. The second drop 3b was applied dropwise onto the second data storage unit 2 (see FIG. 1), while no drop was applied to the first data storage unit 1. The second drop 3b wets regions both of the third layer contact 2a and of the fourth layer contact 2b and is dried. After drying, there remains an electrically conductive connection in the form of a dry substance (see FIG. 5, reference number 3b'), here in the form of electrically conductive polypyrrol.

FIG. 3 then shows various examples of how an inverter component 6 can be programmed by means of the first and the second data storage units 1, 2 in accordance with FIG. 1. An input signal a1 into the inverter component 6 is altered to form an output signal a2, a3 or a4 depending on the programming of the two data storage units 1, 2.

Case 1: Input Signal a1 is Converted into the Output Signal a2

In order to realize this, the first drop 3a is applied dropwise onto the data storage unit 1 in accordance with FIG. 1 and an electrically conductive connection is formed between the first layer contact 1a and the second layer contact 1b. No drop is applied to the second data storage unit 2. The interconnect 5 is connected to the contact S1 of the inverter component 6. The two terminals S1 and S2 of the inverter component 6 enable the inverter component 6 to be connected to a supply voltage. In this case, the voltage V1 is present at the second layer contact 1b of the first data storage unit 1 and thus also at terminal S1, which voltage provides the supply voltage for the inverter component 6. The terminal S2 of the inverter component 6 is grounded.

Case 2: Input Signal a1 is Converted into the Output Signal a3

In order to realize this, the second drop 3b is applied dropwise onto the data storage unit 2 in accordance with FIG. 1 and an electrically conductive connection is formed between the third layer contact 2a and the fourth layer contact 2b. No drop is applied to the first data storage unit 1. The interconnect 5 is connected to the contact S1 of the inverter component 6. In this case, the fourth layer contact 2b of the second data storage unit 2 and thus also the terminal S1 are connected to ground. The terminal S2 of the inverter component 6 is likewise grounded.

Case 3: Input Signal a1 is Converted into the Output Signal a4

In order to realize this, the first drop 3a is applied dropwise onto the data storage unit 1 in accordance with FIG. 1 and an electrically conductive connection is formed between the first layer contact 1a and the second layer contact 1b. No drop is applied to the second data storage unit 2. The interconnect 5 is connected to the terminal S2 of the inverter component 6. The terminal S1 is connected to the voltage V1. In this case, the voltage V1 is present at the second layer contact 1b of the first data storage unit 1 and thus also at the terminal S2, which voltage provides the supply voltage for the inverter component 6.

In the variants according to cases 1 and 2 described above, therefore, the data storage units 1 and 2 according to FIG. 1 are connected by their interconnect 5 to the terminal S1 of the inverter component 6, the terminal S2 of the inverter component being connected to ground. In the variant according to case 3, the data storage units 1 and 2 are connected by their interconnect 5 to the terminal S2 of the inverter component 6, the terminal S1 being connected to the supply voltage. Furthermore, it is also possible for the data storage units 1 and 2 shown in FIG. 1 not just to be connected to one terminal of the inverter component 6, rather for in each case two data storage units interconnected according to FIG. 1 to be connected to the terminal S1 by their interconnect 5 and two further data storage units interconnected according to FIG. 1 to be connected to the terminal S2. It is thereby possible to generate all of the output signals a2, a3 or a4 described above in response to the input signal a1 by drops being correspondingly applied to the individual data storage units.

In accordance with a further exemplary embodiment of the invention, only one data storage unit, which is constructed for example like the data storage unit 1 according to FIG. 1, is connected to the terminal S1 or the terminal S2 of the inverter component 6. Consequently, one of the electrically conductive layer contacts of the data storage units is connected to the terminal S1 or S2 and the other electrically conductive layer contact of the data storage unit is connected to the supply voltage or ground. In this case, it is furthermore provided that the terminal of the inverter component 6 which is connected to the data storage unit is furthermore connected via a high-resistance resistor to ground or to the supply voltage V1. If no drop is applied to the data storage unit, then in the first embodiment variant both the terminal S1 (via the high-resistance resistor) and the terminal S2 are connected to ground and, in the other embodiment variant, both the terminal S1 and the terminal S2 (via the high-resistance resistor) are connected to the supply voltage V1. If a drop is applied to the data storage unit, then in both embodiment variants the terminal S1 is connected to the supply voltage V1 and the terminal S2 is connected to ground, such that the output signal a2 according to FIG. 3 is generated in response to the input signal a1. This interconnection ensures that even when an individual data storage unit is used, the inverter component 6 is always in a defined state and a signal distortion as a result of a "resonant oscillation" of a potential-free terminal of the data storage unit 1 is avoided.

It is furthermore also possible to connect one data storage unit as described above to the terminal S1 and a further data storage unit to the terminal S2 of the inverter component. This affords the advantage that all the output signals a2 to a4 can be generated in response to the input signal a1 by means of just two data storage units.

FIG. 4a then shows various examples of how an inverter component 6 can be programmed by means of two data storage units 7, 8 connected to the signal output Sa of the inverter component 6. An input signal b1 into the inverter component 6 is altered to form an output signal b2, b3 or b4 depending on the programming of the two data storage units 7, 8. The two terminals S1 and S2 of the inverter component 6 enable the inverter component 6 to be connected to a supply voltage, the supply voltage being present at S1 and S2 being connected to ground. It can be seen from FIG. 4b that the first data storage unit 7 has a first layer contact 7a and a second layer contact 7b. The first layer contact 7a is connected—not illustrated here—to the terminal S1. The second data storage unit 8 has a third layer contact 8a and a fourth layer contact 8b. The third layer contact 8a is connected—not illustrated here—to the terminal S2 (ground). The interconnect 5 is connected to the output signal contact Sa of the inverter component 6 and connects the second layer contact 7b, the fourth layer contact 8b and the output signal contact Sa of the inverter component 6.

Case 4: Input Signal b1 is Converted into the Output Signal b2

In order to realize this, no drop is applied either to the first data storage unit 7 or to the second data storage unit 8, the construction of which becomes clearly apparent from FIG. 4b. The first and the second layer contacts 7a, 7b and also the third and the fourth layer contacts 8a, 8b remain electrically insulated from one another.

Case 5: Input Signal b1 is Converted into the Output Signal b3

In order to realize this, a drop is applied to the second data storage unit 8, the construction of which becomes clearly apparent from FIG. 4b, and an electrically conductive connection is formed between the third layer contact 8a and the fourth layer contact 8b. No drop is applied to the first data storage unit 7. In this case, the fourth layer contact 8b of the second data storage unit 8 and thus the terminal Sa are grounded.

Case 6: Input Signal b1 is Converted into the Output Signal b4

In order to realize this, a drop is applied to the first data storage unit 7, the construction of which becomes clearly apparent from FIG. 4b, and an electrically conductive connection is formed between the first layer contact 7a and the second layer contact 7b. No drop is applied to the second data storage unit 8. In this case, the voltage V1 is present at the second layer contact 7b of the first data storage unit 7 and thus also at terminal Sa.

FIG. 5 shows a cross section through a region of a printed electronic circuit in the region of an organic inverter component 6 configured as an OFET, said component being connected to the data storage units 1, 2 in accordance with FIG. 2. The electrically conductive first and third layer contacts 1a, 2a and also the common layer contact 1b, 2b can be discerned on a flexible substrate 10 composed of PET film. The section through the data storage units 1, 2 in accordance with FIG. 2 is taken at the level of the electrically conductive dry substance composed of polypyrrol and finally taken at the level of the interconnect 5 as far as an inverter component 6 not illustrated in FIG. 2. The dry substance that remained from the drop 3b in accordance with FIG. 2 is identified by the reference numeral 3b'. The inverter component 6, represented by an OFET, has a source electrode 11 and a drain electrode 12 in the plane of the data storage units 1, 2, the electrically conductive layer contacts 1a, 1b, 2a, 2b, the source electrode 11 and the drain electrode 12 having been printed from the same material and in one work operation. A whole-area semiconducting organic layer 14 composed of P3AT covers the data storage units 1, 2 and also the source and drain electrodes 11, 12. Situated on the semiconducting layer 14 is a whole-area electrically insulating layer 15 composed of PHS, PMMA, and also a gate electrode 13. The common layer electrode 1b, 2b of the data storage units 1, 2 is electrically conductively connected to the source electrode 11, such that the voltage V2 (see FIG. 1) is present at the source electrode 11. A subsequent reprogramming of the electronic circuit is made impossible by the integration of the electrically conductive dry substance 3b' into the layer construction of the circuit.

With knowledge of the invention, the person skilled in the art is afforded a multiplicity of further possibilities for using the method according to the invention for programming electronic circuits without having to take an inventive step. Thus, a wide variety of logic gates in combination with one or more data storage units which enable programming by application of a liquid substance can be used for the electronic circuit according to the invention.

The invention claimed is:

1. A method for making an electronic circuit comprising:
   forming the circuit with at least one organic electrical functional layer and two circuit selective coupling units;
   forming each of the two circuit selective coupling units with corresponding adjacent first and second electrically conductive layer contacts;
   applying a liquid substance containing an electrically conductive material to at least one of the two circuit selective coupling units to form an electrical connection between the first and second layer contacts of the at least one of the two circuit selective coupling units to thereby cause a voltage applied to the first layer contact of the one of the two circuit selective coupling units to be present on the second layer contacts of the two circuit selective coupling units.

2. The method as claimed in claim 1 wherein the applying the liquid substance step comprises applying the substance dropwise or by dabbing.

3. The method as claimed in claim 2 wherein the step of applying the liquid substance comprises applying the substance as a single drop.

4. The method as claimed in claim 1 including drying the liquid substance to form a dry electrically conductive substance comprising the electrically conductive material to electrically conductively connect the first and the second electrically conductive layer contacts of the at least one of the two circuit selective coupling units.

5. The method as claimed in claim 1 including applying the liquid substance as one of a solution, a suspension, an ink or a paste.

6. The method as claimed in claim 1 wherein the applying step comprises inkjet printing the liquid substance.

7. The method as claimed in claim 1 wherein the applying step comprises applying the liquid substance as a melt and then cooling the melt such that the cooled melt electrically conductively connects the first and the second electrically conductive layer contacts of the at least one of the two circuit selective coupling units.

8. The method as claimed in claim 7 including applying the melt by one of dropwise, printing with an inkjet printer or by a thermal transfer method.

9. The method as claimed in claim 1 including printing the at least one organic electrical functional layer.

10. The method as claimed in claim 1 wherein the forming of the first and second layer contacts comprises forming the contacts coplanar with at least a first electrically conductive functional layer of the electronic circuit.

11. The method as claimed in claim 1 wherein the applying step includes drying the liquid substance to form an electrically conductive dry substance or applying the liquid substance as a melt and cooling the melt to form an electrically conductive solidified substance, further including applying at least a second electrical functional layer of the electronic circuit to one of the electrically conductive dry substance and the electrically conductive solidified substance.

12. The method as claimed in claim 1 wherein the liquid substance has a content of the electrically conductive material within the range of 10 to 100% by weight.

13. The method as claimed in claim 1 including forming the first and the second electrically conductive layer contacts of at least one of the circuit selective coupling units spaced apart from each other a distance A within the range of 1 μm to 100 μm away from one another.

14. The method as claimed in claim 1 wherein the forming of the first and/or the second layer contact of a circuit selective coupling unit comprises forming said first and/or the second layer contact in a comb-shaped with at least two comb tines.

15. The method as claimed in claim 14 wherein the first and second electrically conductive layer contacts of at least one of the circuit selective coupling units are spaced apart from each other a distance A, further including applying the liquid substance dropwise, the liquid substance having a drop diameter $D_T$ greater than the distance.

16. The method as set forth in claim 15 including the step of forming the drop diameter $D_T$ at least as large as the sum of double the distance A and triple the width of one of said comb tines.

17. The method as claimed in claim 1 wherein the applying the liquid substance step applies the substance in a roll-to-roll method during the production of the electronic circuit.

18. The method as set forth in claim 1 including a step of applying different voltages to the first layer contacts of the two circuit selective coupling units.

19. An electronic circuit comprising:
at least one organic electrical functional layer,
two circuit selective coupling units, each circuit selective coupling unit including adjacent first and second electrically conductive layer contacts;
the second layer contacts of the two circuit selective coupling units being electrically conductively connected to one another; and
an electrically conductive dry substance or an electrically conductive solidified substance selectively applied to one of the two circuit selective coupling units for electrically conductively connecting the first and the second electrically conductive layer contacts of the one of the two circuit selective coupling units to one another.

20. The electronic circuit as claimed in claim 19 wherein the electronic circuit includes circuitry forming it as an integrated circuit.

21. The electronic circuit as claimed in claim 19 wherein the electronic circuit comprises at least one organic logic gate electrically conductively connected to the two circuit selective coupling units.

22. The electronic circuit as claimed in claim 21 wherein the organic logic gate is one of an organic inverter, an organic NAND gate and an organic NOR gate.

23. The electronic circuit as claimed in claim 22 wherein the organic inverter includes an organic field effect transistor (OFET) comprising a drain electrode and a source electrode, a gate electrode, a semiconducting layer and an electrically insulating layer.

24. The electronic circuit as claimed in claim 23 wherein the two circuit selective coupling units are coplanar with the drain and source electrodes or with the gate electrode.

25. The electronic circuit as claimed in claim 21 wherein the organic logic gate has a supply voltage path, the two circuit selective coupling units being in the supply voltage path of the organic logic gate.

26. The electronic circuit of claim 21 wherein the organic logic gate has a signal input path, the two circuit selective coupling units being in the signal input path of the organic logic gate.

27. The electronic circuit as claimed in claim 21 wherein the organic logic gate has a signal output path, the two circuit selective coupling units being located in the signal output path of the organic logic gate.

28. The electronic circuit as claimed in claim 21 wherein the second electrically conductive layer contacts of the two circuit selective coupling units being electrically conductively connected to the organic logic gate.

29. The electronic circuit as claimed in claim 19 wherein the first and the second electrically conductive layer contacts each have a thickness within the range of 10 nm to 2 μm.

30. The electronic circuit as claimed in claim 19 wherein the first and the second electrically conductive layer contacts each have a width within the range of 1 μm to 100 μm.

31. The electronic circuit as claimed in claim 19 wherein the first and the second electrically conductive layer contacts of at least one of the circuit selective coupling units are at a distance A within the range of 1 μm to 100 μm from one another.

32. The electronic circuit as claimed in claim 19 wherein the first and/or the second electrically conductive layer contacts of the circuit selective coupling units are configured in comb-shaped fashion with at least two comb tines and the first and the second electrically conductive layer contacts of each of the two circuit selective coupling units are intermeshed with one another.

33. The electronic circuit as claimed in claim 19 wherein the two circuit selective coupling units are alongside one another.

34. The electronic circuit as claimed in claim 19 wherein the two circuit selective coupling units are one behind another.

35. The electronic circuit as claimed in claim 19 wherein the first and second electrically conductive layer contacts comprise a metallic or organic electrically conductive material.

36. The electronic circuit as claimed in claim 19 wherein the electrically conductive dry substance or the electrically conductive solidified substance comprises an electrically conductive material comprising metallic and/or organic conductive materials.

37. The electronic circuit as claimed in claim 19 including a flexible substrate and wherein the electronic circuit is on the flexible substrate.

* * * * *